(12) United States Patent
Wang et al.

(10) Patent No.: US 10,302,711 B2
(45) Date of Patent: May 28, 2019

(54) SPIN HALL EFFECT MAGNETIC STRUCTURES

(71) Applicant: Regents of the University of Minnesota, Minneapolis, MN (US)

(72) Inventors: Jian-Ping Wang, Shoreview, MN (US); Angeline Klemm Smith, Hillsboro, OR (US); Mahdi Jamali, Folsom, CA (US); Zhengyang Zhao, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 15/918,942

(22) Filed: Mar. 12, 2018

(65) Prior Publication Data
US 2018/0203077 A1    Jul. 19, 2018

Related U.S. Application Data

(62) Division of application No. 14/946,069, filed on Nov. 19, 2015.
(Continued)

(51) Int. Cl.
*G01R 33/07* (2006.01)
*G01R 33/12* (2006.01)
(Continued)

(52) U.S. Cl.
CPC ......... *G01R 33/075* (2013.01); *G01R 33/077* (2013.01); *G01R 33/1284* (2013.01); *H01L 43/04* (2013.01); *H01L 43/06* (2013.01)

(58) Field of Classification Search
CPC ... H01L 43/04; H01L 43/06; G11C 11/14–16; G11C 11/161; G01R 33/075; G01R 33/077; G01R 33/1284
See application file for complete search history.

(56) References Cited

U.S. PATENT DOCUMENTS 8,604,572 B2 * 12/2013 Wang .................... B82Y 25/00
257/421
8,889,433 B2    11/2014 De Brosse et al.
(Continued)

OTHER PUBLICATIONS

"International Technology Roadmap for Semiconductors (ITRS) Emerging Research Devices," ITRS, 2011, 83 pp. (Applicant points out, in accordance with MPEP 609.04(a), that the year of publication, 2011, is sufficiently earlier than the effective U.S. filing date, Sep. 18, 2015, so that the particular month of publication is not in issue.).
(Continued)

*Primary Examiner* — Allison Bernstein
(74) *Attorney, Agent, or Firm* — Shumaker & Sieffert, P.A.

(57) ABSTRACT

An article may include a substantially perpendicularly magnetized free layer having a first magnetic orientation in the absence of an applied magnetic field. The article may also include a spin Hall channel layer configured to conduct a spin current configured to subject the perpendicularly magnetized free layer to a magnetic switching torque and a substantially in-plane magnetized bias layer configured to bias the substantially perpendicularly magnetized free layer to a second magnetic orientation. The second magnetic orientation is different than the first magnetic orientation and is out of a plane of the substantially perpendicularly magnetized free layer.

14 Claims, 8 Drawing Sheets

Related U.S. Application Data

(60) Provisional application No. 62/220,740, filed on Sep. 18, 2015.

(51) Int. Cl.
*H01L 43/04* (2006.01)
*H01L 43/06* (2006.01)

(56) References Cited

U.S. PATENT DOCUMENTS

| | | |
|---|---|---|
| 9,105,832 B2 | 8/2015 | Buhrman et al. |
| 9,218,864 B1 | 12/2015 | Yi et al. |
| 2014/0264671 A1* | 9/2014 | Chepulskyy ............ H01L 43/08 257/421 |

OTHER PUBLICATIONS

Jariwala et al., "Emerging Device Applications for Semiconducting Two-Dimensional Transition Metal Dichalcogenides," ACS Nano, vol. 8, No. 2, Jan. 29, 2014, pp. 1102-1120.
Jansen, "Silicon spintronics," Nature Materials, vol. 11, Review Articles, Apr. 23, 2012, pp. 400-408.
Sinova et al., "New moves of the spintronics tango," Nature Materials, vol. 11, May 2012, pp. 368-371.
"Everspin debuts first Spin-Torque MRAM for high performance storage systems," Everspin Technologies, Nov. 12, 2012, 3 pp.
Kim et al., "Extended scalability of perpendicular STT-MRAM towards sub-20nm MTJ node," IEDM11-531, IEEE, Dec. 5-7, 2011, 4 pp.
Gajek et al., "Spin torque switching of 20 nm magnetic tunnel junctions with perpendicular anisotropy," Applied Physics Letters, vol. 100, 132408, Mar. 28, 2012, 4 pp.
De Castro et al., "Sub-nanosecond Precessional Switching in a MRAM Cell with a Perpendicular Polarizer," 2012 4th IEEE International Memory Workshop, May 20-23, 2012, 4 pp.
Liu et al., "Spin-Torque Switching with the Giant Spin Hall Effect of Tantalum," Science, vol. 336, May 4, 2012, pp. 555-558.
Miron et al., "Current-driven spin torque induced by the Rashba effect in a ferromagnetic metal layer," Nature Materials, vol. 9, Jan. 10, 2010, pp. 230-234.
Manchon et al., "Spin Hall effect-driven spin torque in magnetic textures," Applied Physics Letters, vol. 99, No. 2, 022504, Jul. 13, 2011, 5 pp.
Pai et al., "Spin transfer torque devices utilizing the giant spin Hall effect of tungsten," Applied Physics Letters, vol. 101, 122404, Sep. 18, 2012, 5 pp.
Liu et al., "Current-Induced Switching of Perpendicularly Magnetized Magnetic Layers Using Spin Torque from the Spin Hall Effect," Physical Review Letters, vol. 109, 096602, Aug. 29, 2012, 5 pp.
Cubukcu et al., "Spin-orbit torque magnetization switching of a three-terminal perpendicular magnetic tunnel function," Applied Physics Letters, vol. 104, 042406, Jan. 30, 2014, 6 pp.
Yu et al., "Switching of perpendicular magnetization by spin-orbit torques in the absence of external magnetic fields," Nature Nanotechnology, vol. 9, May 11, 2014, pp. 548-554.
Miron et al., "Perpendicular switching of a single ferromagnetic layer induced by in-plane current injection," Nature, vol. 476, Letter, Aug. 11, 2011, 6 pp.
Zhao et al., "Spin Hall switching of the magnetization in Ta/TbFeCo structures with bulk perpendicular anisotropy," Applied Physics Letters, vol. 106, 132404, Mar. 31, 2015, 5 pp.
Lee et al., "Threshold current for switching of a perpendicular magnetic layer induced by spin Hall effect," Applied Physics Letters, vol. 102, 112410, Mar. 20, 2013, 6 pp.
Prosecution History from U.S. Appl. No. 14/946,069, dated Sep. 12, 2017 through Dec. 11, 2017, 21 pp.

* cited by examiner

SPIN HALL EFFECT MAGNETIC STRUCTURES

This application is a divisional of U.S. patent application Ser. No. 14/946,069, filed on Nov. 19, 2015, which claims the benefit of Provisional U.S. patent application Ser. No. 62/220,740, titled "SPIN HALL EFFECT MAGNETIC STRUCTURES," filed on Sep. 18, 2015, each of which is incorporated herein in its entirety by reference.

GOVERNMENT SUPPORT

This invention was made with government support under Grant No. HR0011-13-3-0002 awarded by the Department of Defense/Defense Advanced Research Projects Agency (DARPA). The government has certain rights in the invention.

TECHNICAL FIELD

This disclosure relates to articles including magnetic structures that exhibit the spin Hall effect.

BACKGROUND

The scaling of conventional semiconductor devices may be limited by factors including device reliability and increased power consumption. Improvement in the performance of memory and computational devices is continuously pursued. Spin-based or spintronic devices may be used as alternatives to or in conjunction with electronic devices. Spin-based effects may be used by devices such as spintronic devices that harness the intrinsic spin of electrons and their associated magnetic moments, in addition to electronic phenomena that arise from the fundamental electronic charges of electrons. Magnetic structures may be used in spintronic devices including memory and computational devices. For example, memory devices such as magnetic random access memory (MRAM) or spin-transfer torque random access memory (STT-RAM) may be based on the relative magnetic orientation of multiple magnetic layers. Computational devices such as spin logic or spin neuron device also may be based on these layers. Reliable and cost-effective fabrication of memory and computational devices using integrated magnetic structures continues to pose difficulties.

SUMMARY

In some examples, the disclosure describes an article including a substantially perpendicularly magnetized free layer having a first magnetic orientation in the absence of an applied magnetic field. The article includes a spin Hall channel layer configured to generate a spin current configured to subject the perpendicularly magnetized free layer to a magnetic switching torque. The article also includes a substantially in-plane magnetized bias layer configured to bias the substantially perpendicularly magnetized free layer to a second magnetic orientation that is different than the first magnetic orientation. The second magnetic orientation is out of a plane of the substantially perpendicularly magnetized free layer.

In some examples, the disclosure describes an article including an anisotropically graded free magnetic layer and a spin Hall channel layer configured to generate a spin current configured to modify the magnetic orientation of the anisotropically graded free magnetic layer.

In some examples, the disclosure describes a technique including biasing a substantially perpendicularly magnetized free layer from a first magnetic orientation to a second magnetic orientation that is different than the first magnetic orientation by exerting a stray magnetic field from a substantially in-plane magnetized bias layer on the substantially perpendicular magnetized free layer. The second magnetic orientation may be out of a plane of the substantially perpendicularly magnetized free layer, and the substantially perpendicularly magnetized free layer may have the first magnetic orientation in the absence of an applied magnetic field. The technique also may include generating a spin current through a spin Hall channel layer to subject the substantially perpendicularly magnetized free layer to a magnetic switching torque.

In some examples, the disclosure describes a technique including generating a spin current through a spin Hall channel layer disposed adjacent an anisotropically graded free magnetic layer. The anisotropic graded magnetic layer exhibits a magnetic anisotropy gradient that varies from substantially perpendicular magnetic anisotropy at a surface opposite the spin Hall channel layer to non-perpendicular magnetic anisotropy at a surface adjacent to the spin Hall channel layer.

In some examples, the disclosure describes a technique including depositing a substantially perpendicularly magnetized free layer over a spin Hall channel layer. The example technique also includes depositing a spacer layer over the substantially perpendicularly magnetized free layer. The example technique also includes depositing a substantially in-plane magnetized bias layer over the spacer layer. The substantially perpendicularly magnetized free layer is dipole-coupled to the substantially in-plane magnetized bias layer. The substantially in-plane magnetized bias layer is configured to magnetically bias the substantially perpendicularly magnetized free layer.

In some examples, the disclosure describes a technique including depositing a substantially in-plane magnetized bias layer over a spin Hall channel layer and depositing a spacer layer on the substantially in-plane magnetized bias layer. The example technique also includes depositing a substantially perpendicularly magnetized free layer on the spacer layer. The spacer layer has a predetermined thickness to tune a strength of exchange coupling between the substantially perpendicularly magnetized free layer and the substantially in-plane magnetized bias layer.

The details of one or more examples are set forth in the accompanying drawings and the description below. Other features, objects, and advantages will be apparent from the description and drawings, and from the claims.

DETAILED DESCRIPTION

Figure 1:
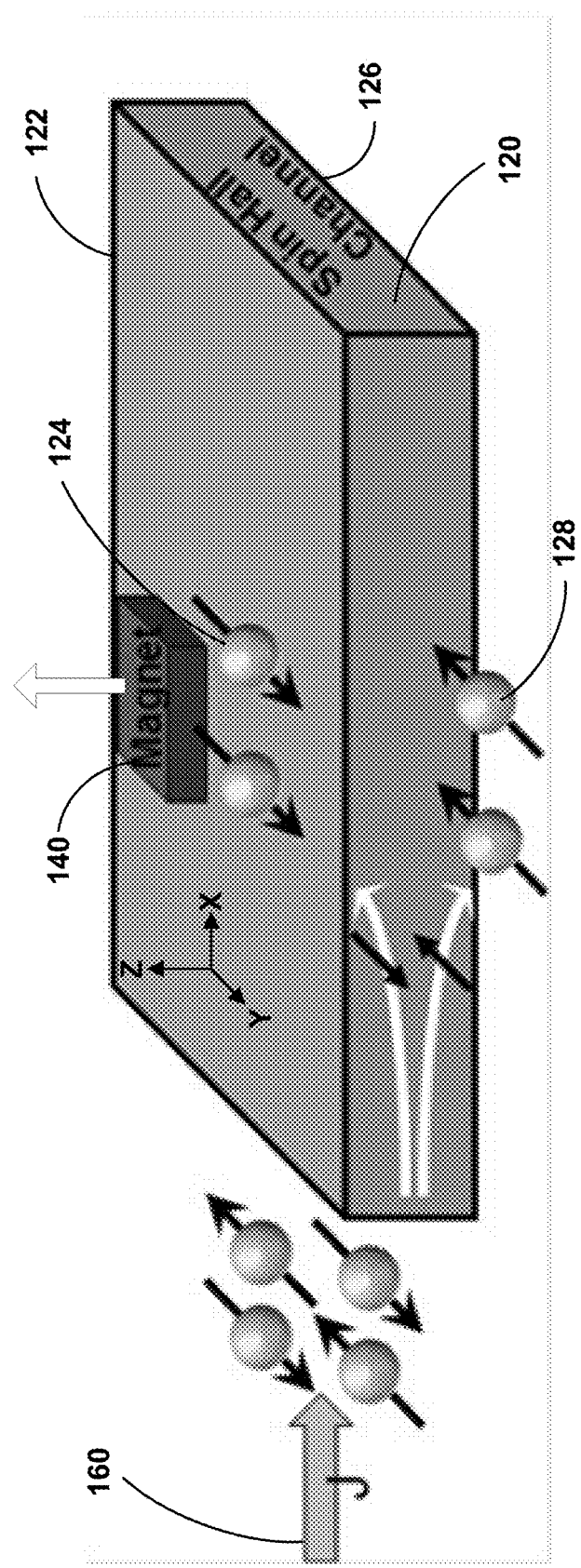
FIG. 1 is a conceptual and schematic block diagram illustrating an example spin Hall channel generating a spin current.

The spin Hall effect (SHE) is a technique for generating a spin current by passing a charge current through a non-magnetic material utilizing spin-orbit interactions. FIG. 1 is a conceptual and schematic block diagram illustrating an example spin Hall channel generating a spin current. Input current 160 may be injected into a spin Hall channel 120 (for example, a tantalum layer). Spin-orbit coupling (SOC) splits the electrons from the input charge current 160 according to their spin direction. For example, electrons 124 with up-spin accumulate on one surface, for example, the top surface 122 of the spin Hall channel 120, and electrons 128 with down-spin accumulate on the other surface, for example, the bottom surface 126 of the spin Hall channel 120. The aligned spin may then exert a torque on a neighboring magnetic structure (140) and may result in changes in magnetization of the magnetic structure 140, for example, switching of a magnetic orientation of a magnetic layer in magnetic structure 140. For example, as shown in FIG. 1, the input charge current 160 may be spin polarized in the Y-axis direction, which may exert on a perpendicularly magnetized layer with magnetic orientation in the Z-direction a spin Hall magnetic torque in the ±X-axis direction (a cross product of the vector representing the spin polarization and the vector representing the magnetization). In the case of in-plane magnetized materials, the spin Hall effect may be sufficient to cause even a reversal in magnetic orientation. However, in the case of perpendicularly magnetized materials, the application of an in-plane field may be required in addition to the spin Hall current in order to break symmetry and achieve deterministic switching using the spin Hall effect. Using perpendicularly magnetized materials may help scale SHE devices for high density and thermally stable memory applications, due to high magnetic anisotropy values, and may achieve switching without an external field, in contrast with conventional devices, which cannot be switched without using an external field.

The spin Hall effect may be used to overcome problems such as dielectric breakdown of the tunnel barrier at high current densities required for write operations. For example, unlike in the case of a STT-RAM cell in which current for writing is required to pass through a high resistance tunnel barrier, in SHE devices, the write current may not pass through a magnetic structure and may instead only pass through the spin Hall channel adjacent a magnetic layer or structure 140 (FIG. 1). Therefore, SHE memory devices may be more reliable compared to STT-RAM. Moreover, due to the lower resistivity of metals, less Joule heating may be involved during the write process and utilizing the SHE may save energy compared to STT-RAM. Additionally, since the read and write passes are different, they can be independently optimized for better performance. Spin Hall effect based devices may be more efficient than STT-RAM due to geometrical gain of the spin Hall effect magnetic torque.

The present disclosure describes switching, for example, a reversal of magnetic orientation of a perpendicularly magnetized layer in a magnetic structure, for example a CoFeB composite structure, using the SHE, without an externally generated magnetic field. Previous techniques for achieving switching in perpendicularly magnetized materials without the assistance of an externally applied field may utilize a wedge structure to achieve external-field free switching. However, using wedge structures limits scalability due to difficulty creating and reliably controlling the wedge structure at the required dimensions for high memory density and at wafer scale. Wedge structures also create difficulties in preparing complex material stacks such as those used in magnetic tunnel junctions (MTJ). The disclosure describes magnetic structures that do not include a wedge structure, which may allow advantages including uniform thickness and design across the device and integration with full MTJ stacks.

Figure 2A:
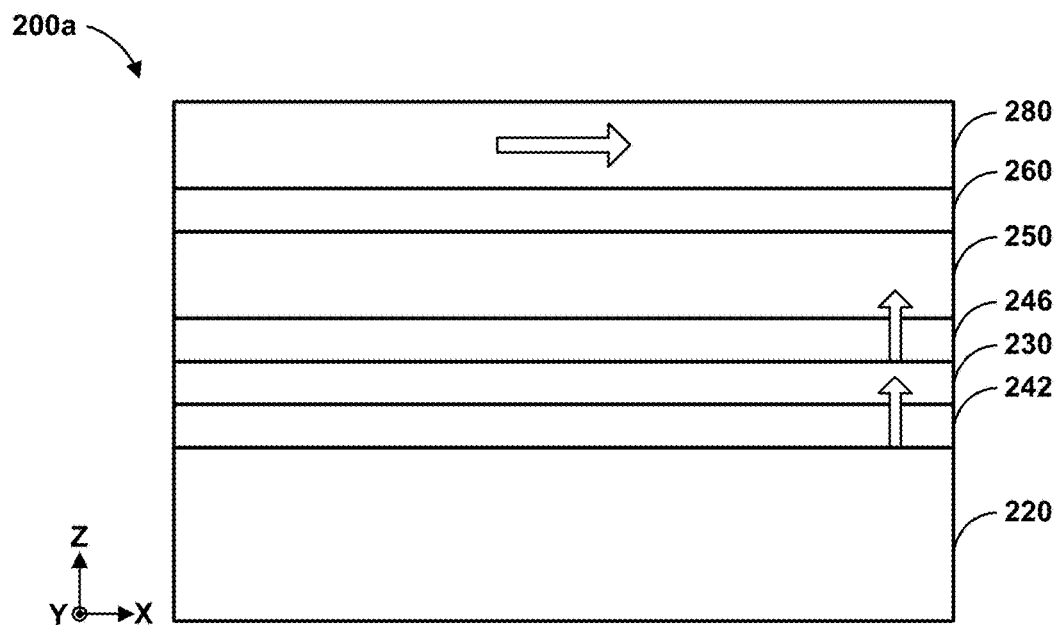
FIGS. 2A and 2B are conceptual and schematic block diagrams illustrating example articles including a substantially in-plane magnetized bias layer coupled to a substantially perpendicularly magnetized free layer.

FIG. 2A is a conceptual and schematic block diagram illustrating an example article 200a including a substantially in-plane magnetized bias layer 280 dipole coupled to a substantially perpendicularly magnetized free layer 242. An article 200a includes a substantially perpendicularly magnetized free layer 242 having a first magnetic orientation in the absence of an applied magnetic field. The substantially perpendicularly magnetized free layer 242 includes a magnetic material formed in such a manner to allow a magnetic moment of the layer to change from the first magnetic orientation to another magnetic orientation, for example, under the influence of a stray field or under the influence of spin torque from exerted by spin polarized current generated through spin Hall channel layer 220. The substantially perpendicularly magnetized free layer 242 may be formed so that its magnetic moment is oriented in the first magnetic orientation in the absence of an external magnetic field, for example, in a magnetically stable state. In some examples first magnetic orientation is substantially parallel to the magnetic easy axis of substantially perpendicularly magnetized free layer 242. In the example shown in FIG. 2A, the first magnetic orientation is substantially perpendicular to a major plane of the substantially perpendicularly magnetized free layer 242, for example, substantially perpendicular to the plane of the film layers of the substantially perpendicularly magnetized free layer 242. For example, the first magnetic orientation may be exactly at an angle of 90°, or may slightly deviate from 90°, for example, the first magnetic orientation may be within a in a range of 90°±10°, or 90°±5°, or 90°±3°, or 90°±1°, or 90°±0.5°, or 90°±0.1°, or of from about 80°, or from about 83°, or from about 85°, or from about 87°, or from about 89°, or from about 89.5°, or from about 89.9°, to about 90.1°, or to about 90.5°, or to about 91°, or to about 93°, or to about 95°, or to about 97°, or to about 100°.

The substantially perpendicularly magnetized free layer 242 may be formed of magnetic metals or alloys, such as, for example, a CoFeB alloy. A thickness of the substantially perpendicularly magnetized free layer 242 may be selected based on a number of variables, including, for example, the expected magnitude of the spin Hall torque, and thermal stability of the magnetic orientation, or the like. For example, the substantially perpendicularly magnetized free layer 242 may have a thickness of about 1.2 nm.

Article 200a also includes spin Hall channel layer 220 configured to generate a spin current that subjects perpendicularly magnetized free layer 242 to a magnetic switching torque. Spin Hall channel layer 220 may include a material that exhibits spin current polarization, for example, tantalum (Ta), chromium (Cr), bismuth (Bi), bismuth selenide ($Bi_2Se_3$), gallium arsenide (GaAs), indium gallium arsenide (InGaAs), tungsten (W), platinum (Pt), gold (Au), and multilayers formed with one or more of these materials and one or more of aluminum (Al), silver (Ag), copper (Cu), or the like. In some examples, spin Hall channel layer 220 may have a thickness of about 5 nm.

Article 200a also may include a substantially perpendicularly magnetized pinned layer 246, which may be disposed adjacent substantially perpendicularly magnetized free layer 242, with an insulating barrier layer 230 disposed between substantially perpendicularly magnetized pinned layer 246 and substantially perpendicularly magnetized free layer 242. In some examples, substantially perpendicularly magnetized pinned layer 246 may include a magnetic material formed in a manner such that its magnetic moment is substantially fixed in an orientation normal to the plane of substantially perpendicularly magnetized pinned layer 246. In some examples, the magnetic moment substantially persists in the fixed orientation even under the influence of external or stray fields that may be experienced by substantially perpendicularly magnetized pinned layer 246 during designed use. For example, as shown in FIGS. 2A, a magnetic moment of substantially perpendicularly magnetized pinned layer 246 is fixed in a perpendicular direction (i.e., a direction normal to the major plane of substantially perpendicularly magnetized pinned layer 246). In some examples, substantially perpendicularly magnetized pinned layer 246 may include $Fe_{0.5}Pt_{0.5}$.

Insulating barrier layer 230 may include a nonmagnetic material, such as, for example, an oxide or a dielectric material. In some examples, insulating barrier layer 230 may act as a tunnel barrier, for example, so that the stack of substantially perpendicularly magnetized pinned layer 246 and substantially perpendicularly magnetized free layer 242 forms a magnetic tunnel junction. Insulating barrier layer 230 may be formed of a tunnel barrier material, for example, MgO or the like. In some examples, insulating barrier layer 230 may be sufficiently thin to allow electrons to tunnel across insulating barrier layer 230. For example, insulating barrier layer 230 may have a thickness of about 2 nm.

In some examples, article 200a further includes an antiferromagnetic layer 250, which may be disposed adjacent substantially perpendicularly magnetized pinned layer 246, and serves to pin the magnetic moment of substantially perpendicularly magnetized pinned layer 246 through antiferromagnetic coupling.

In some examples, article 200a also includes a capping layer 260, which may be disposed adjacent the magnetic tunnel junction stack, or adjacent the antiferromagnetic layer 250. As shown in FIG. 2A, in some examples, substantially in-plane magnetized bias layer 280 is disposed on capping layer 260.

Article 200a also includes a substantially in-plane magnetized bias layer 280. The substantially in-plane magnetized bias layer 280 may exert a stray magnetic field effective to bias substantially perpendicularly magnetized free layer 242 to a second magnetic orientation that is different than the first magnetic orientation. For example, the stray magnetic field may cause the second magnetic orientation to be tilted away from the first magnetic orientation even in the absence of an externally applied magnetic field. In some examples, the second magnetic orientation may be out of a plane of substantially perpendicularly magnetized free layer 242, and is not perpendicular to the plane of substantially perpendicularly magnetized free layer 242. For example, the second magnetic orientation may be slightly different from the first magnetic orientation, such that the second magnetic orientation is out of the plane of the substantially perpendicularly magnetized free layer. The deviation from the first magnetic orientation may allow substantially perpendicularly magnetized free layer 242 to be switched deterministically.

Substantially in-plane magnetized bias layer 280 may include a magnetic material formed in a manner such that its magnetic moment is substantially fixed in an orientation along the plane or in the plane of substantially in-plane magnetized bias layer 280. In some examples, the magnetic moment substantially persists in the fixed orientation even under the influence of external or stray fields that may be experienced by substantially in-plane magnetized bias layer 280 during designed use. For example, as shown in FIG. 2A, a magnetic moment of substantially in-plane magnetized bias layer 280 is fixed in an in-plane direction (i.e., a direction within the major plane). However, the magnetic moment of substantially in-plane magnetized bias layer 280 may be oriented in a direction other than 0° with respect to the plane of substantially in-plane magnetized bias layer 280. For example, the magnetic moment of the substantially in-plane magnetized bias layer 280 may be oriented at exactly an angle of 0° with respect to the major plane of substantially in-plane magnetized bias layer 280, or may be at an angle other than 0°, for example, the magnetic moment may be oriented within a in a range of 0°±10°, or 0°±5°, or 0°±3°, or 0°±1°, or 0°±0.5°, or 0°±0.1°, or of from about −10°, or from about −5°, or from about −3°, or from about −1°, or from about −0.5°, or from about −0.1°, to about 0.1°, or to about 0.5°, or to about 1°, or to about 3°, or to about 5°, or to about 10° with respect to the plane of substantially in-plane magnetized bias layer 280.

Various magnetic materials may be used for forming substantially in-plane magnetized bias layer 280, including, for example, cobalt-iron-boron (CoFeB) alloys, palladium/cobalt (Pd/Co) multilayer structures, combinations thereof, or the like. The thickness of substantially in-plane magnetized bias layer 280 may be selected based on variables including, for example, the material used to form substantially perpendicularly magnetized layer 242, a thickness of the substantially perpendicularly magnetized layer 242, a thickness of spin Hall channel layer 220, separation or spacing between a major surface of substantially in-plane magnetized bias layer 280 and a major surface of one or both of substantially perpendicularly magnetized fixed layer 242 and spin Hall channel layer 220, or the like. In some examples, substantially in-plane magnetized bias layer 280 may have a thickness of about 3 nm.

In the absence of substantially in-plane magnetized bias layer 280, the magnetic switching torque exerted by the spin-polarized current generated in spin Hall channel layer 220 during a write technique may not deterministically switch a magnetization of substantially perpendicularly magnetized layer 242. The effective torque associated with the spin Hall effect may switch the magnetization in either a first direction or a second, exactly opposite direction. For example, when the spin polarization is in a transverse direction, such as along a Y-axis, the electron current is along an X axis, and the initial magnetic orientation is along a Z-axis (where orthogonal x-y-z axes are shown in FIG. 2A for sake of illustration only), the effective spin Hall torque switch the magnetization in either the X-Z plane or the negative (−) X-Z plane. Thus, in some examples, substantially perpendicularly magnetized free layer 242 may be dipole-coupled to substantially in-plane magnetized bias layer 280. For example, substantially in-plane magnetized bias layer 280 may exert a dipole field or a stray field to bias substantially perpendicularly magnetized layer 242 by breaking symmetry of the substantially perpendicularly magnetized layer 242. Thus, substantially perpendicularly magnetized layer 242 may be switched deterministically under the influence of a switching magnetic torque (spin torque) exerted by spin-polarized current generated in spin Hall channel layer 220. Spin Hall channel layer 220 may not influence the substantially in-plane magnetized bias layer 280, since in some examples, the substantially in-plane magnetized bias layer 280 is spaced in the Z-axis direction from spin Hall channel layer 220 and does not contact spin Hall channel layer 220, as shown in FIG. 2A. In some examples, substantially perpendicularly magnetized free layer 242 is disposed between substantially in-plane magnetized bias layer 280 and spin Hall channel layer 220, for example, as shown in FIG. 2A. In some examples, the substantially perpendicularly magnetized free layer 242 may be disposed adjacent the spin Hall channel layer 220.

Electrically conductive leads may be disposed coupled to opposite ends or side of spin Hall channel 220 to enable passing current as required to switch the article 200a from the first magnetic orientation to the second magnetic orientation. In some examples, an STT-RAM device or a MTJ device may include article 200a. For example, a memory cell or a computational unit may include article 200a.

In the example shown in FIG. 2A, substantially perpendicularly magnetized free layer 242 is disposed between substantially in-plane magnetized bias layer 280 and spin Hall channel layer 220 and the substantially in-plane magnetized bias layer 280 is dipole coupled to the substantially perpendicularly magnetized free layer 242. In other examples, substantially in-plane magnetized bias layer 280 may be exchange coupled to substantially perpendicularly magnetized free layer 242, as shown in FIG. 2B.

Figure 2B:
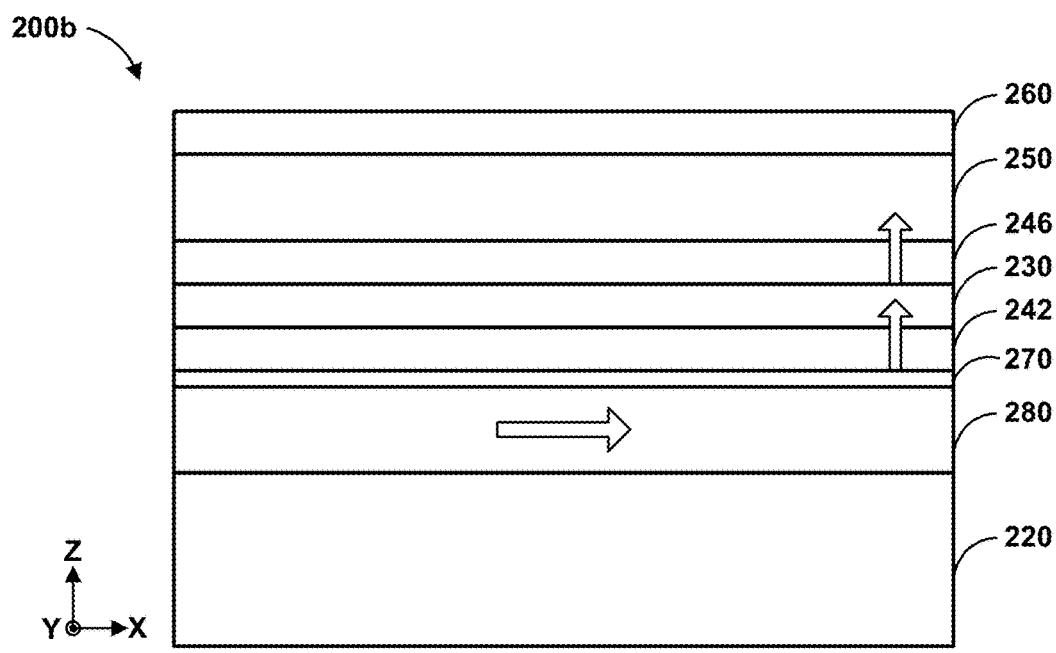

FIG. 2B is a conceptual and schematic block diagram illustrating an example article 200b including substantially in-plane magnetized bias layer 280 exchange coupled to a substantially perpendicularly magnetized free layer 242. Similar to article 200a of FIG. 2A, article 200b of FIG. 2B may include a spin Hall channel layer 220, an insulating barrier layer 230, a substantially perpendicularly magnetized free layer 242, a substantially perpendicularly magnetized pinned layer 246, an antiferromagnetic layer 250, and a capping layer 260, and an substantially in-plane magnetized bias layer 280. The structure and materials of these layers may be similar to or substantially the same as described above with respect to FIG. 2A, aside from the differences described herein.

Unlike article 200a of FIG. 2A, in article 200b, substantially in-plane magnetized bias layer 280 is disposed sufficiently close to substantially perpendicularly magnetized free layer 242 to exchange couple the magnetic moments of substantially in-plane magnetized bias layer 280 and substantially perpendicularly magnetized free layer 242 near the adjacent surfaces of substantially in-plane magnetized bias layer 280 and substantially perpendicularly magnetized free layer 242. For example, a spacer layer 270 may be disposed between substantially in-plane magnetized bias layer 280 and substantially perpendicularly magnetized free layer 242. In this way, substantially in-plane magnetized bias layer 280 may bias the magnetic moment of substantially perpendicularly magnetized free layer 242 away from perpendicular, at least near the surface of substantially perpendicularly magnetized free layer 242 near substantially in-plane plane magnetized bias layer 280. Further, in some examples, a spin polarized current generated in spin Hall channel 220 may switch an orientation of substantially in-plane magnetized bias layer 280, which then exerts a magnetic torque on substantially perpendicularly magnetized free layer 242. In one or both of these ways, substantially in-plane magnetized bias layer 280, which is exchange coupled to substantially perpendicularly magnetized layer 242, may facilitate deterministic switching of the magnetization of substantially perpendicularly magnetized layer 242 by a spin polarized current generated in spin Hall channel 220.

In some examples, as shown in FIG. 2B, article 200b may include spacer layer 270 between substantially in-plane magnetized bias layer 280 and substantially perpendicularly magnetized free layer 242. For example, spacer layer 270 may facilitate tuning of the strength of exchange coupling between substantially perpendicularly magnetized free layer 242 and substantially in-plane magnetized bias layer 280. For example, a thicker spacer layer 270 may result in weaker exchange coupling between substantially perpendicularly magnetized free layer 242 and substantially in-plane magnetized bias layer 280, while a thinner spacer layer 270 may result in stronger exchange coupling between substantially perpendicularly magnetized free layer 242 and substantially in-plane magnetized bias layer 280. In some examples, the thickness of spacer layer 270 may be greater than 0 nm and less than about 1 nm. In some examples, spacer layer 270 may include a material that exhibits spin current polarization, for example, Ta, Ru, Cr, W, Pt, Au, Al, Ag, Cu, or the like. In some examples, the material from which spacer layer 270 is formed may have an opposite spin Hall angle polarity compared to the material from which spin Hall channel layer 220 is formed. This may enhance the spin Hall effect and facilitate switching of the magnetic moment of substantially perpendicularly magnetized free layer 242.

Example articles including a substantially in-plane magnetized bias layer magnetically coupled to a substantially perpendicularly magnetized free layer have been described above. Example articles including graded magnetic free layers are described below.

Figure 3A:
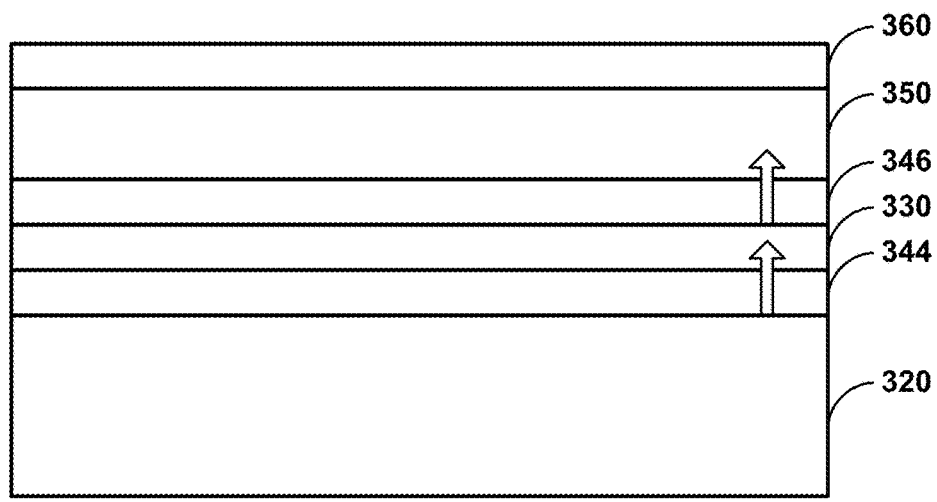
FIG. 3A is a conceptual and schematic block diagram illustrating an example article including a spin Hall channel layer and an anisotropically graded free magnetic layer.

FIG. 3A is a conceptual and schematic block diagram illustrating an example article including a spin Hall channel layer 320 and an anisotropically graded free magnetic layer 344. Article 300 also includes an insulating barrier layer 330 on anisotropically graded free magnetic layer 344, a substantially perpendicularly magnetized pinned layer 346 on insulating barrier layer 330, an antiferromagnetic layer 350 on substantially perpendicularly magnetized pinned layer 346, and a cap layer 360 on antiferromagnetic layer 350. Insulating barrier layer 330, substantially perpendicularly magnetized pinned layer 346, antiferromagnetic layer 350, and cap layer may be similar to or substantially the same as the corresponding layers described in FIGS. 2A and 2B.

Figure 3B:
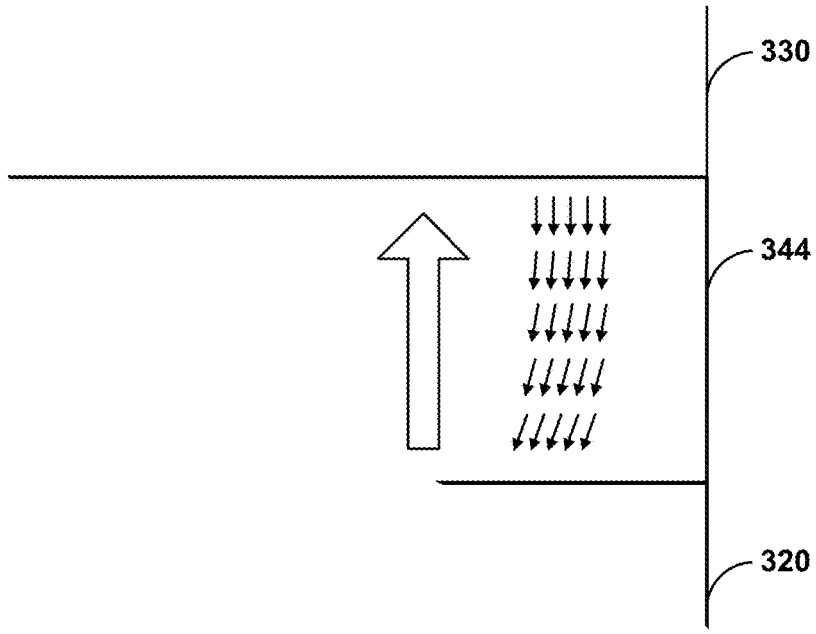
FIG. 3B is an enlarged illustration of the anisotropically graded free magnetic layer of FIG. 3A.

Anisotropically graded free magnetic layer 344 may include one or more of a Co-Pd alloy, an Fe-Pt alloy, an Fe-Pd alloy, or a Heusler alloy. For example, anisotropically graded free magnetic layer 344 may include $Fe_xPt_{1-x}$ or $Fe_xPd_{1-x}$, with x ranging from 0.4 to 0.7, or a Heusler alloy, such as $Cu_2MnAl$, $Cu_2MnIn$, $Cu_2MnSn$, $MnBi$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, or $Co_2FeGe$. In some examples, the anisotropic graded magnetic layer 344 may exhibit a magnetic anisotropy gradient that varies from substantially perpendicular magnetic anisotropy at a surface opposite spin Hall channel layer 320 to non-perpendicular magnetic anisotropy at a surface adjacent to spin Hall channel layer 320, as shown in FIG. 3B. FIG. 3B is an enlarged illustration of anisotropically graded free magnetic layer 344 of FIG. 3A.

In article 300, anisotropically graded free magnetic layer 344 may exhibit a first magnetic configuration when no current is passed through spin Hall channel layer 320, and in the absence of an external field. The first magnetic configuration may include the magnetic moments of the individual magnetic domains or grains within anisotropically graded free magnetic layer 344 being substantially parallel to their respective magnetic easy axes. For example, the first magnetic configuration may include a first group of magnetic domains within a first layer oriented substantially at a first angle, a second group of magnetic domains within a second layer oriented substantially at a second angle, and so on, including an n-th group of magnetic domains within an n-th layer oriented substantially at an n-th angle. In some examples, the angle may vary from the first angle to the n-th angle, for example, from 90° to an angle that deviates from 90° by ±10°, or ±5°, or ±1°, or ±0.1°. When a spin polarized current is passed through spin Hall channel layer 320, spin polarized current may exert a magnetic switching torque effective to initiate switching of the first group of magnetic domains, for example, in a boundary layer near the surface of anisotropically graded free magnetic layer 344 adjacent spin Hall channel layer 320. As the angle of the first group of magnetic domains changes, the magnetic torque from the first group of magnetic domains, along with magnetic torque from the spin polarized current may be sufficient to initiate switching of the second group of magnetic domains, which may eventually propagate to switching of the n-th group of magnetic domains. Eventually, the entire anisotropically graded magnetic free layer 320 may switch to a second magnetic configuration including the changed orientations of each group of magnetic domains. In some examples, in the second magnetic configuration, the magnetic moments of the respective magnetic domains are oriented substantially anti-parallel to their orientations in the first magnetic orientation. Thus, passing a current through spin Hall channel layer 320 may switch the magnetic orientation of anisotropically graded magnetic free layer 344 from the first magnetic configuration to the second magnetic configuration.

Figure 4:
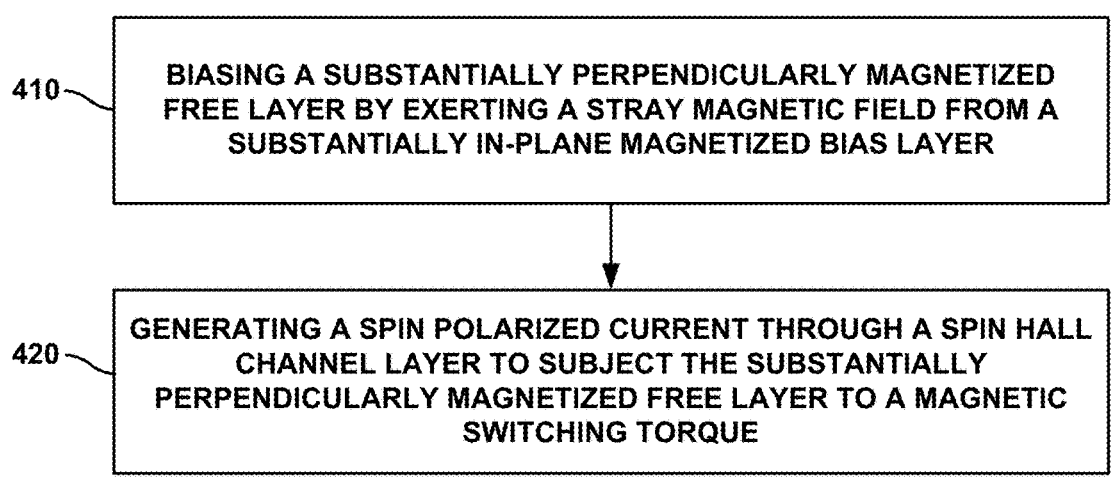
FIG. 4 is a flow diagram illustrating an example technique for switching a substantially perpendicularly magnetized free layer.

FIG. 4 is a flow diagram illustrating an example technique for switching a substantially perpendicularly magnetized free layer using a spin polarized current generated in a spin Hall channel layer. The technique of FIG. 4 will be described with concurrent reference to article 200a of FIG. 2 for purposes of illustration only, and it will be understood that other articles may implement the technique of FIG. 4, and the article of FIG. 4 may be used to implement other techniques. The example technique includes biasing substantially perpendicularly magnetized free layer 242 to a second magnetic orientation using a magnetic field from substantially in-plane magnetized bias layer 280 (410). As described above, the magnetic field from substantially in-plane magnetized bias layer 280 may bias the magnetic orientation of substantially perpendicularly magnetized free layer 242 away from the first magnetic orientation (e.g., away from the magnetic easy axis of substantially perpendicularly magnetized free layer 242). In some examples, the bias amount may be on the order of a few degrees. By biasing the magnetic orientation of substantially perpendicularly magnetized free layer 242 away from a substantially perpendicular orientation, substantially in-plane magnetized bias layer 280 may facilitate deterministic switching of the magnetic orientation of substantially perpendicularly magnetized free layer 242 by the spin polarized current generated in spin Hall channel 220.

The technique of FIG. 4 includes generating a spin polarized current through spin Hall channel 220 (440). Generating the spin polarized current may subject substantially perpendicularly magnetized free layer 242 to a magnetic switching torque, which may cause the magnetic orientation of substantially perpendicularly magnetized free layer 242 to switch from the second magnetic orientation to a third magnetic orientation that may be substantially anti-parallel to the second magnetic orientation. The third magnetic orientation may be an energetically stable orientation, in the direction of the magnetic easy axis of substantially perpendicularly magnetized free layer 242, aside from the bias caused by the magnetic field of substantially in-plane magnetized bias layer 280.

In some examples, substantially perpendicularly magnetized free layer 242 is disposed between substantially in-plane magnetized bias layer 280 and spin Hall channel 220 and is dipole-coupled to substantially in-plane magnetized bias layer 280, as illustrated in FIG. 2A. In other examples, substantially in-plane magnetized bias layer 280 is disposed between substantially perpendicularly magnetized free layer 242 and spin Hall channel 220, as illustrated in FIG. 2B. Substantially in-plane magnetized bias layer 280 may be exchange coupled to substantially perpendicularly magnetized free layer 242. A similar technique to that illustrated in FIG. 4 may be used to switch substantially perpendicularly magnetized free layer 242 in the example shown in FIG. 2B, although the bias of the magnetic orientation of at least part of substantially perpendicularly magnetized free layer 242 by substantially in-plane magnetized bias layer 280 is due to exchange coupling rather than dipole coupling.

Figure 5:
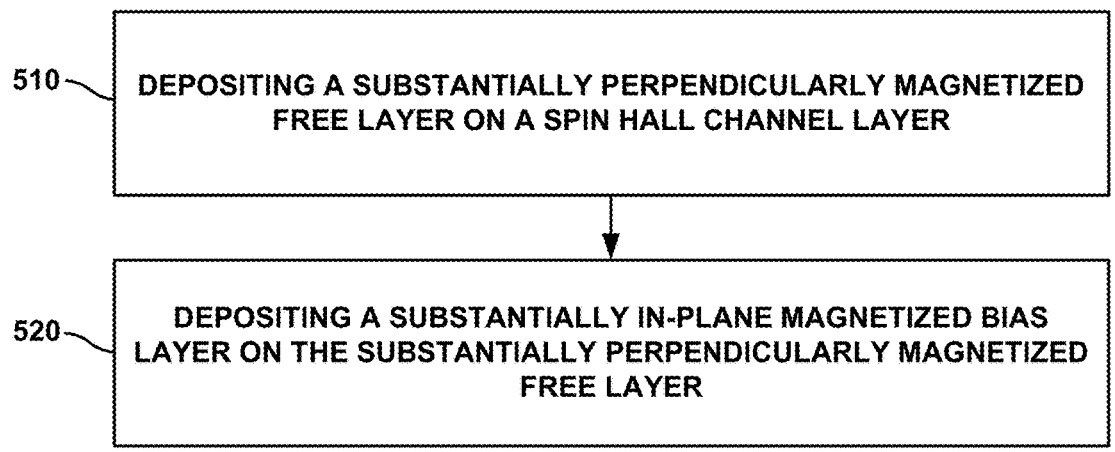
FIG. 5 is a flow diagram illustrating an example technique for preparing a magnetic structure including a spin Hall channel layer.

FIG. 5 is a flow diagram illustrating an example technique for preparing a magnetic structure including a spin Hall channel layer. The example technique includes depositing a substantially perpendicularly magnetized free layer on a spin Hall channel layer (510). The technique may also include depositing a substantially in-plane magnetized bias layer on the substantially perpendicularly magnetized free layer (520). Alternatively, the technique may include depositing a spacer layer on the spin Hall channel layer after step 510, and depositing the substantially in-plane magnetized bias layer on the spacer layer. The substantially perpendicularly magnetized free layer may be dipole-coupled to the substantially in-plane magnetized bias layer. The substantially in-plane magnetized bias layer may be configured to exert a stray magnetic field effective to bias the substantially perpendicularly magnetized free layer. Techniques for depositing may include, for example, sputtering, chemical vapor deposition, physical vapor deposition, photolithography, ion milling, or the like.

Figure 6:
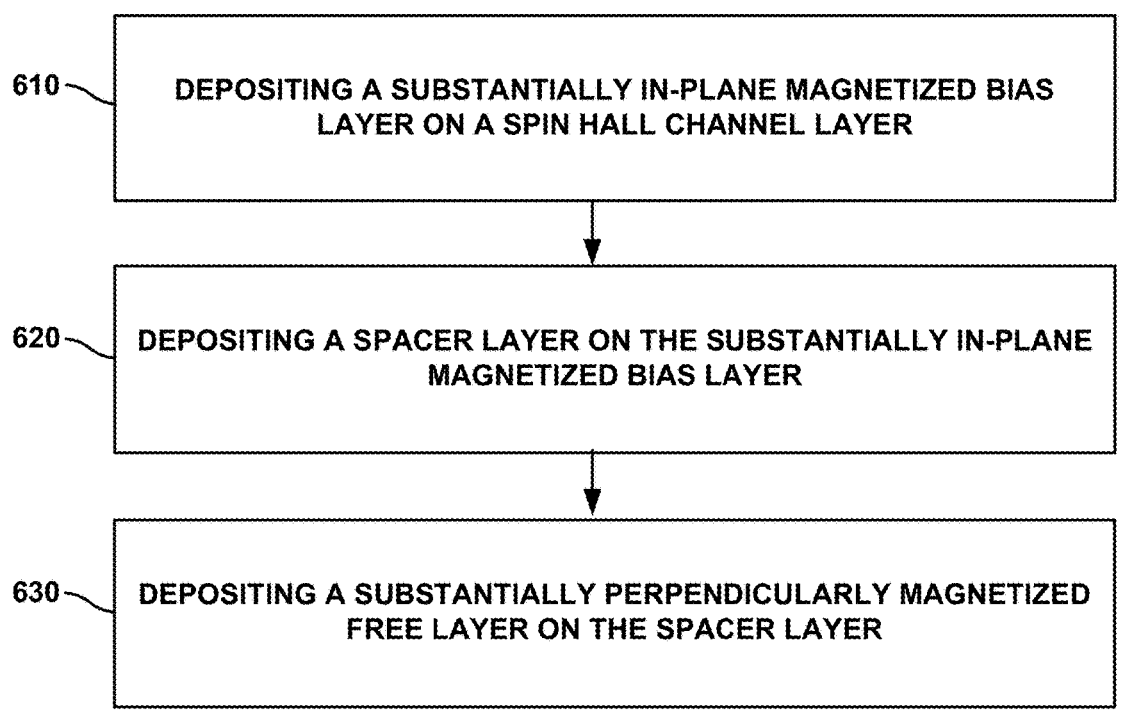
FIG. 6 is a flow diagram illustrating an example technique for preparing a magnetic structure including a spin Hall channel layer.

FIG. 6 is a flow diagram illustrating an example technique for preparing a magnetic structure including a spin Hall channel layer. The example technique includes depositing a substantially in-plane magnetized bias layer on a spin Hall channel layer (610). The example technique may include depositing a spacer layer on the substantially in-plane magnetized bias layer (620). The example technique may further include depositing a substantially perpendicularly magnetized free layer on the spacer layer. The spacer layer may have a predetermined thickness to tune a strength of exchange coupling between the substantially perpendicularly magnetized free layer and the substantially in-plane magnetized bias layer. Techniques for depositing may include the techniques discussed above with reference to FIG. 5.

EXAMPLES

Example 1

Figure 7A:
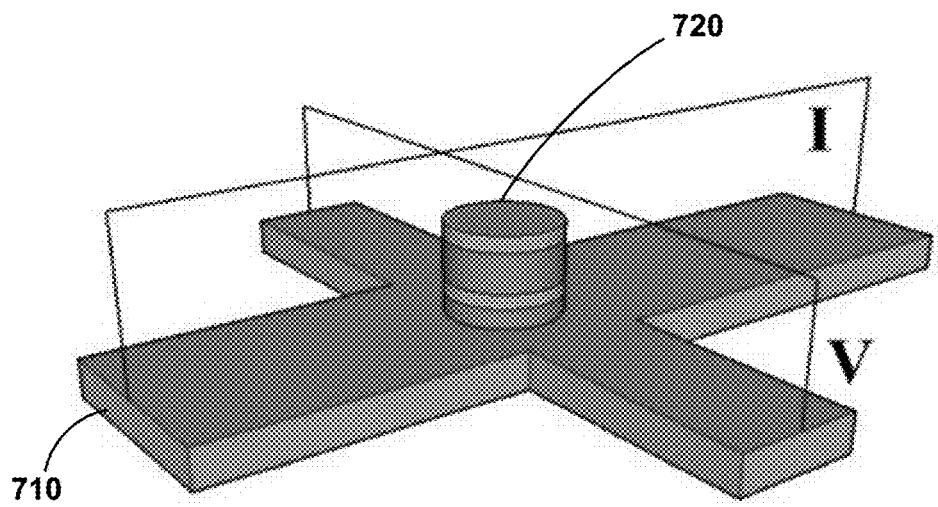
FIG. 7A is a conceptual and schematic block diagram illustrating an example magnetic structure dipole coupled with a spin Hall channel layer.
Figure 7B:
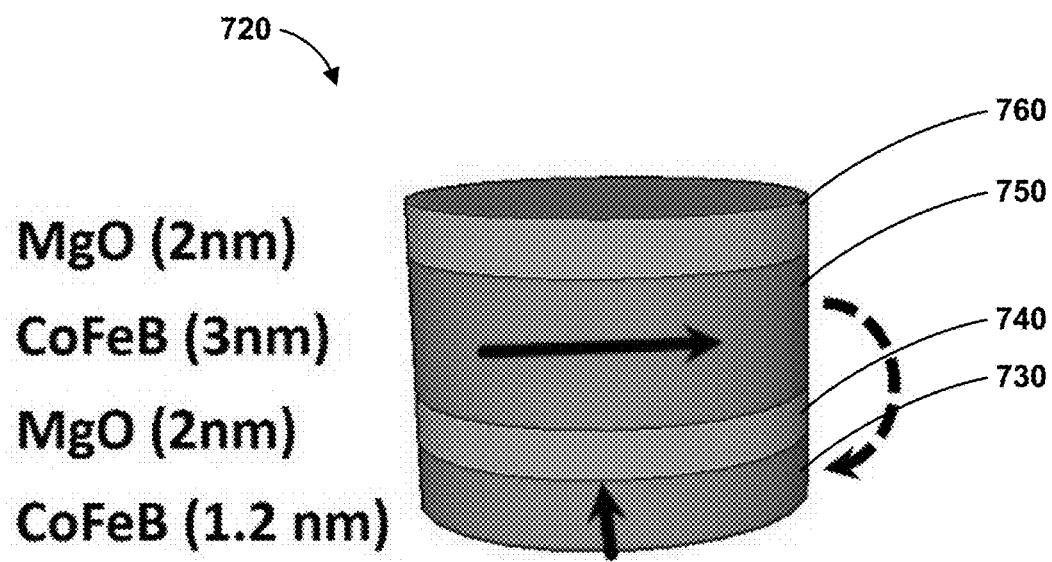
FIG. 7B is an enlarged conceptual diagram illustrating the magnetic structure of FIG. 7A.

FIG. 7A is a conceptual and schematic block diagram illustrating an example magnetic structure dipole coupled with a spin Hall channel layer. A magnetic structure 720 is disposed on a spin Hall channel layer 710. Voltage V across the structure and current I flowing through the spin Hall channel layer 710 may be measured as shown in FIG. 7A. FIG. 7B is an enlarged conceptual diagram illustrating the magnetic structure of FIG. 7A. A magnetic stack structure included a 5 nm Ta layer for the spin Hall channel layer 710, a 1.2 nm CoFeB perpendicularly magnetized free layer 730, a 2 nm MgO insulating layer 740, a 3 nm in-plane magnetized bias layer 750, and a 2 nm MgO cap layer 760, as shown in FIG. 7B. A reference structure included a 5 nm Ta spin Hall channel layer, a 1.2 nm CoFeB perpendicularly magnetized layer, and a 2 nm MgO cap layer. For the fabrication of the example stack and the reference structure, photolithography and ion milling were used to form a Hall bar region of 30 μm wide. Then, photolithography and ion milling were used to pattern and define a circular magnetic pillar in the center of each Hall bar region. The pillars had a diameter of 4×6 μm².

Figure 8A:
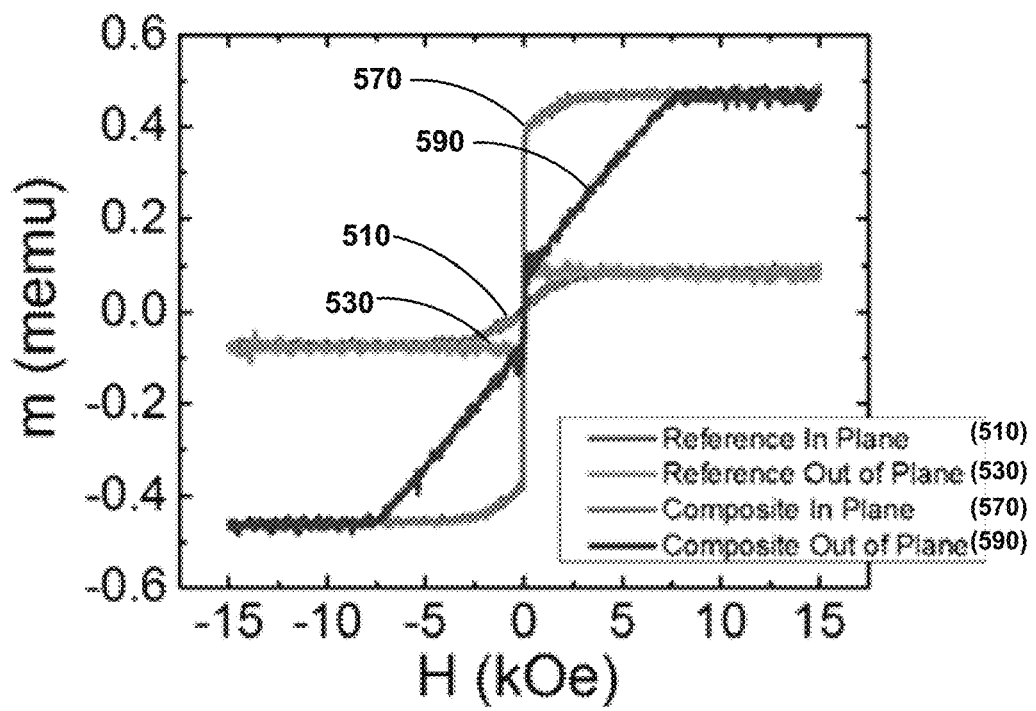
FIG. 8A is a chart presenting vibrating sample magnetometer measurements for the example structures of FIGS. 7A and 7B and a reference structure.
Figure 8B:
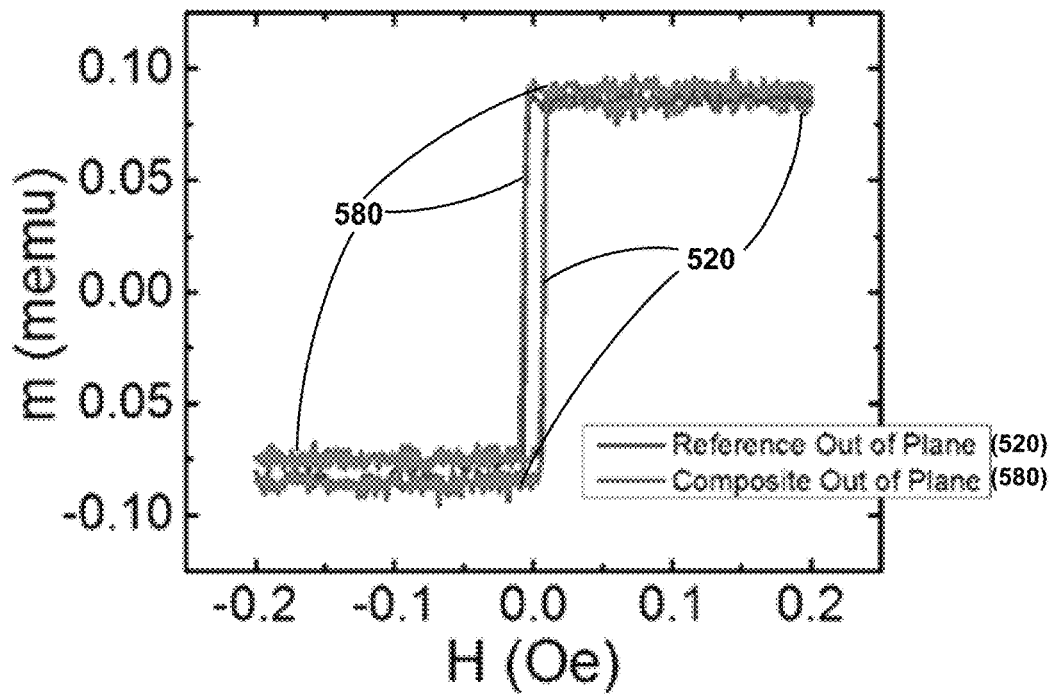
FIG. 8B is a chart presenting a small field scan of the example structures of FIGS. 7A and 7B and a reference structure.

FIG. 8A is a chart presenting vibrating sample magnetometer measurements for the example structure of FIGS. 7A and 7B and the reference structure. FIG. 8A indicates that both perpendicular and in-plane magnetization components are present in the example stack structure of FIGS. 7A and 7B. FIG. 8B is a chart presenting a small field scan of the example structure of FIGS. 7A and 7B and the reference structure. FIG. 8B indicates that the example stack structure and the reference structure had substantially the same perpendicular magnetic component. Thus, FIGS. 8A and 8B are indicative of the perpendicular anisotropy of the 1.2 nm thick CoFeB layer.

Example 2

Figure 9C:
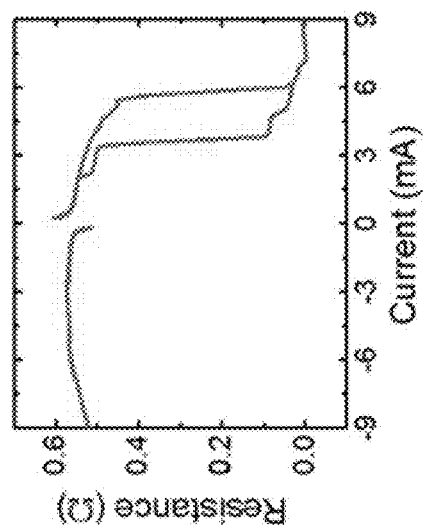
FIG. 9C is a chart presenting spin current induced magnetization switching of the example structure of 7A, in the absence of an externally applied field.
Figure 9B:
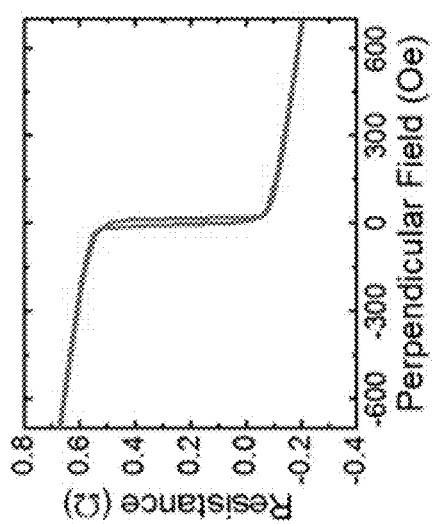
FIG. 9B is a chart presenting the anomalous Hall resistance as a function of perpendicular field strength for the example structure of FIG. 7A.
Figure 9A:
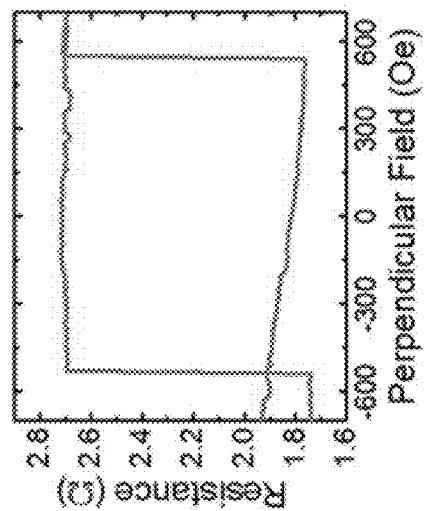
FIG. 9A is a chart presenting the anomalous Hall resistance as a function of perpendicular field strength for a reference structure.

The respective switching behaviors of the example stack structure and the reference structure were investigated. The anomalous Hall resistance was used to measure and determine changes in the perpendicular magnetization. Changes in the measured anomalous Hall resistance are indicative of changes in the perpendicular component of the magnetization since $R_{AHE}(=V_H/1)$ is proportional to the perpendicular component of the magnetization. FIGS. 9A and 9B show the anomalous Hall resistance for the reference structure and the example stack structure, respectively, when an externally applied perpendicular field is swept from −700 Oe to +700 Oe. FIG. 9A is a chart presenting the anomalous Hall resistance as a function of perpendicular field strength for the reference structure. FIG. 9B shows a significant reduction in the coercivity of the example stack structure compared to the reference structure, which indicated interaction between in-plane magnetic bias layer and the perpendicularly magnetized free layer within the example stack structure.

Current induced switching was investigated in the example stack structure of FIG. 7A. Current was applied and swept along the Hall bar and the anomalous Hall resistance was measured to monitor the change in magnetization. Before beginning the measurement, an external perpendicular field was applied to ensure the magnetization was saturated. No external field was applied during the measurement. As shown in FIG. 9C, at a current strength of about 6 mA, there is a change in RARE which indicated a change in the perpendicular magnetization direction of the CoFeB free magnetic layer. As the current was then reduced, RAHE changed back to the original value at about 3.5 mA, which corresponds to the magnetization direction changing back to the original state. Due to the composite structure of the example stack structure, perpendicular magnetization switching was successfully achieved without the use of any externally applied fields.

Various examples have been described. These and other examples are within the scope of the following claims.

What is claimed is:

1. An article comprising:
   an anisotropically graded free magnetic layer; and
   a spin Hall channel layer configured to generate a spin current configured to modify the magnetic orientation of the anisotropically graded free magnetic layer, wherein the anisotropically graded magnetic layer exhibits a magnetic anisotropy gradient that varies from a substantially perpendicular magnetic anisotropy at a surface opposite the spin Hall channel layer to a non-perpendicular magnetic anisotropy at a surface adjacent to the spin Hall channel layer.

2. The article of claim 1, wherein the anisotropically graded magnetic layer comprises at least one of a Heusler alloy, an Fe—Pd alloy, or an Fe—Pt alloy.

3. The article of claim 2, wherein the Heusler alloy comprises at least one of $Cu_2MnAl$, $Cu_2MnIn$, $Cu_2MnSn$, $MnBi$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, or $Co_2FeGe$.

4. The article of claim 1, wherein the anisotropically graded magnetic layer comprises at least one of $Fe_xPt_{1-x}$ or $Fe_xPd_{1-x}$, wherein x is between about 0.4 and about 0.7.

5. The article of claim 1, further comprising a substantially perpendicularly magnetized pinned layer and an insulating barrier layer between the substantially perpendicularly magnetized pinned layer and the anisotropically graded free magnetic layer.

6. A method comprising:
   generating a spin current through a spin Hall channel layer disposed adjacent an anisotropically graded free magnetic layer, wherein the anisotropically graded magnetic layer exhibits a magnetic anisotropy gradient that varies from substantially perpendicular magnetic anisotropy at a surface opposite the spin Hall channel layer to non-perpendicular magnetic anisotropy at a surface adjacent to the spin Hall channel layer.

7. The method of claim 6, further comprising switching the anisotropically graded free magnetic layer from a first magnetic configuration to a second magnetic configuration by generating the spin current.

8. The method of claim 7, wherein magnetic moments of individual magnetic domains or grains within the anisotropically graded free magnetic layer are substantially parallel to their respective magnetic easy axes in the first configuration.

9. The method of claim 8, wherein magnetic moments of individual magnetic domains or grains within the anisotropically graded free magnetic layer are oriented substantially anti-parallel to their orientations in the first magnetic orientation.

10. The method of claim 6, wherein the anisotropically graded magnetic layer comprises at least one of a Heusler alloy, an Fe—Pd alloy, or an Fe—Pt alloy.

11. The method of claim 10, wherein the Heusler alloy comprises at least one of $Cu_2MnAl$, $Cu_2MnIn$, $Cu_2MnSn$, MnBi, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2Mnin$, $Pd_2MnSn$, $Pd_2MnSb$, $Co_2FeSi$, $Co_2FeAl$, $Fe_2VAl$, $Mn_2VGa$, or $Co_2FeGe$.

12. The method of claim 6, wherein the anisotropically graded magnetic layer comprises at least one of $Fe_xPt_{1-x}$ or $Fe_xPd_{1-x}$, wherein x is between about 0.4 and about 0.7.

13. An article comprising:

an anisotropically graded free magnetic layer, wherein the anisotropically graded magnetic layer comprises a Heusler alloy, and wherein the Heusler alloy comprises at least one of $Cu_2MnAl$, $Cu_2MnIn$, $Cu_2MnSn$, MnBi, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, or $Co_2FeGe$; and a spin Hall channel layer configured to generate a spin current configured to modify the magnetic orientation of the anisotropically graded free magnetic layer.

14. The article of claim 13, further comprising a substantially perpendicularly magnetized pinned layer and an insulating barrier layer between the substantially perpendicularly magnetized pinned layer and the anisotropically graded free magnetic layer.

* * * * *

UNITED STATES PATENT AND TRADEMARK OFFICE
CERTIFICATE OF CORRECTION

PATENT NO. : 10,302,711 B2
APPLICATION NO. : 15/918942
DATED : May 28, 2019
INVENTOR(S) : Jian-Ping Wang et al.

It is certified that error appears in the above-identified patent and that said Letters Patent is hereby corrected as shown below:

In the Claims

Column 13, Line 22 (Claim 11): Replace "Pd2Mnin" with --Pd2MnIn--

Signed and Sealed this
Thirty-first Day of March, 2020

Andrei Iancu
*Director of the United States Patent and Trademark Office*